(12) United States Patent
Chang et al.

(10) Patent No.: US 9,666,537 B2
(45) Date of Patent: May 30, 2017

(54) METHODS AND APPARATUS USING FRONT-TO-BACK ALIGNMENT MARK AND PLACEMENT FOR NARROW WAFER SCRIBE LINES

(71) Applicant: Texas Instruments Incorporated, Dallas, TX (US)

(72) Inventors: Simon Y S Chang, Plano, TX (US); Arnold C. Conway, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 100 days.

(21) Appl. No.: 14/698,187

(22) Filed: Apr. 28, 2015

(65) Prior Publication Data

US 2015/0380358 A1 Dec. 31, 2015

Related U.S. Application Data

(60) Provisional application No. 62/018,825, filed on Jun. 30, 2014.

(51) Int. Cl.
*H01L 21/78* (2006.01)
*H01L 23/544* (2006.01)

(52) U.S. Cl.
CPC .... *H01L 23/544* (2013.01); *H01L 2223/5442* (2013.01); *H01L 2223/5446* (2013.01); *H01L 2223/54426* (2013.01); *H01L 2924/0002* (2013.01)

(58) Field of Classification Search
CPC ... H01L 2223/54426; H01L 2223/5446; H01L 23/544

USPC .......................................................... 438/462
See application file for complete search history.

(56) References Cited

U.S. PATENT DOCUMENTS

| | | | | |
|---|---|---|---|---|
| 6,071,656 A | 6/2000 | Lin | | |
| 6,277,532 B1* | 8/2001 | Yahiro | ................... | B82Y 10/00 430/22 |
| 6,278,957 B1* | 8/2001 | Yasuda | ................. | G03F 9/7003 702/127 |
| 7,005,718 B2* | 2/2006 | Wester | .............. | H01L 27/14685 257/431 |
| 8,970,006 B2* | 3/2015 | Renna | ............... | H01L 21/76898 257/620 |
| 9,064,873 B2* | 6/2015 | Miao | ................... | H01L 23/5283 |

(Continued)

*Primary Examiner* — Luan C Thai
(74) *Attorney, Agent, or Firm* — Tuenlap D. Chan; Charles A. Brill; Frank D. Cimino

(57) ABSTRACT

Methods and apparatus for front-to-back alignment using narrow scribe lines are disclosed. An apparatus is disclosed that includes a semiconductor wafer comprising a plurality of areas for the fabrication of integrated circuit devices on a device side, the integrated circuit devices arranged in rows and columns and spaced from one another by a plurality of scribe lines disposed on the semiconductor wafer in areas between the integrated circuit devices and free from integrated circuit devices; and one or more alignment marks disposed on the semiconductor wafer, the alignment marks positioned in an intersection of two of the scribe lines; wherein the scribe lines have a first minimum dimension and the one or more alignment marks have a second minimum dimension that is greater than the first minimum dimension. Methods and additional apparatus are disclosed.

8 Claims, 9 Drawing Sheets

(56) References Cited

U.S. PATENT DOCUMENTS

2009/0243122 A1    10/2009  Summerfelt et al.
2010/0072578 A1*   3/2010  Kunishima ........... H01L 23/585
                                                                        257/620

* cited by examiner

METHODS AND APPARATUS USING FRONT-TO-BACK ALIGNMENT MARK AND PLACEMENT FOR NARROW WAFER SCRIBE LINES

RELATED APPLICATIONS

The present application claims the benefit of priority under 35 U.S.C. §119(e) to U.S. Provisional Application Ser. No. 62/018,825 filed Jun. 30, 2014, entitled "PHOTOLITHOGRAPHY FRONT-TO-BACK ALIGNMENT MARK FOR EXTREME NARROW SCRIBE," which application is hereby incorporated by reference herein in its entirety.

TECHNICAL FIELD

This application relates to the field of integrated circuits, and more specifically, to the use of alignment marks and alignment mark placement within narrow scribe lines or scribe streets.

BACKGROUND

Semiconductor integrated circuits are fabricated using photolithographic techniques on thin semiconductor disks commonly referred to as "wafers." Regarding a semiconductor wafer, the side of the wafer where a majority of circuits are formed is commonly referred to as the "device side" or "front side" or "top side" and the opposite side is commonly referred to as the "backside" or "bottom side." When forming the integrated circuits on the semiconductor wafer, a space between them is required for separating the circuits into individual units. Those spaces are termed "scribe lines" or "scribe streets" or "saw streets." The photolithographic techniques performed during fabrication of the integrated circuits on the semiconductor wafer use photolithographic patterns formed on glass or other transparent plates which are commonly referred to as "photomasks." In the photolithographic processing, a photoresist layer is formed over the semiconductor wafer. This layer is formed of photosensitive material. The photoresist layer is used to control the specific wafer areas that are subjected to subsequent steps such as etch, implant, or oxide formation for example. A photomask is then positioned and light is used to transfer the pattern of the photomask onto the photoresist. The exposed photoresist (depending on the chemical composition, the photoresist can be a positive or negative resist) is then chemically developed and areas of the photoresist are removed or are not removed depending on the pattern of the photomask. The manufacture of the various components in current complex integrated circuit manufacture often requires more than a dozen of these photomasks be used in a specific order, each containing a pattern that is transferred to the photoresist and the pattern is then used to process the wafer. The spatial alignment of each of the photomasks to the semiconductor wafer is critical to the successful creation of the components of the integrated circuit.

To facilitate the visual alignment of the photomasks to the semiconductor wafer, features are formed in the photomasks and also on the device side of the wafers that are called "alignment marks." The wafer alignment marks are formed during processing of the wafer and may be formed of a metal that was patterned in a prior processing step, e.g. tantalum, tungsten, titanium, platinum, chromium, gold, or the like, or by etching trenches or shapes into the silicon. As the continuing processing can destroy, damage or obscure prior alignment marks, additional alignment marks can sometimes be made at later processing steps to ensure alignment is possible for subsequent processing.

Traditionally, integrated circuits have been built on a single side, the device side, of the semiconductor wafer. Alignment marks are also formed on the device side of the wafer, commonly several times as the processing of the wafer can render an existing alignment mark unusable for the following process steps. In recent modern integrated circuits, particularly those including Micro Electrical and Mechanical System (MEMS) devices, integrated circuit devices are sometimes created with structures or components on opposing sides of the wafer, the device side and the backside. A common backside component for MEMS devices is a cavity on the backside of the wafer. The cavity can extend to the devices formed on the device side of the wafer. For example, a backside etch can be used to create a lens opening corresponding to a MEMS device or to a photocell. The backside processing has created a need for an alignment camera on the chuck side of the processing tools as well as the normal position on the device side of the wafer. This backside processing requirement arises because the alignment marks, previously formed on the device side of the wafer, are now positioned facing the tool chuck, or downwards. A camera or microscope located under the wafer chuck enables the use of the device side alignment marks to be used to align the wafer to the photomask. This is called "front-to-back" alignment or "F2B" alignment. In typical F2B alignment, the system compares an alignment mark on the device side of a wafer to a photomask positioned above the opposing backside of the wafer. In some systems, an image superposition is performed and displayed during alignment so that the reference marks and the alignment marks can be visually compared and alignment can be performed until the relative spatial positions are correct.

Differentiating between the alignment marks on the wafer and the marks on the photomask, the alignment marks on the photomasks are commonly referred to as "reference marks" and the marks on the wafers are commonly referred to as "alignment marks." Using the alignment marks and the reference marks together, the photomasks and the semiconductor wafers are visually aligned during the processing of the wafer.

Alignment and reference marks are used by both automated optical recognition systems as well as by human operators. Automated and manual alignment systems are used and some systems begin with an initial visual manual alignment and then use automatic alignment to complete the visual alignment process. Alternatively, a coarse alignment can be performed automatically with the human operator completing the visual alignment. Alignment cameras or microscopes are used that have various stages of magnification, where the lower power magnification provides a wider field of view and the higher power magnifications provide finer resolution and facilitate more precise alignment. Magnification can be from 1× to 10× or more depending on the stage of the semiconductor processing. Displays such as computer monitors are used to assist the visual alignment process.

FIG. 1A depicts in a prior art illustration the various components involved in the device side alignment. A device side alignment camera 110 focuses "down" toward the photomask 120. The wafer 130, which is positioned with the device side "up" towards the photomask, is affixed to the wafer chuck 140, typically with a vacuum. The backside alignment camera 150 is pointed upwards as shown. In the conventional device side processing, the backside alignment camera 150 is typically not used.

Initially the photomask 120 is positioned in the processing tool in a known location. The wafer chuck 140 is moved to a loading position (not illustrated) where a wafer 130 is placed on the wafer chuck with the device side up. A vacuum source (not shown) is employed to hold the wafer to the chuck. The wafer chuck 140 then moves to an initial rough alignment position beneath the photo mask 120. The device side alignment camera or microscope 110 is used to look down through the photomask while the operator or alternatively, an automatic system, moves the wafer chuck 140 until the wafer alignment marks are visually centered with the photomask reference marks. In some arrangements, the initial alignment is performed manually and subsequent alignments can be performed automatically. The wafers can be visually aligned in at least 2 locations to the photomask to ensure proper alignment.

FIG. 1B depicts in a prior art illustration the previous components of FIG. 1A now configured for F2B alignment. A device side alignment camera 110 focuses down toward the photomask 120. The wafer 130, which is positioned with the backside oriented "up" as shown in FIG. 1B, so that a photoresist can be patterned to enable a subsequent etch or another semiconductor manufacturing operation to be performed on the backside, is affixed to the wafer chuck 140, typically with a vacuum. The backside alignment camera 150, mounted under the wafer chuck 140, is pointed upwards as illustrated and can view the wafer thru slots 142a, 142b in the wafer chuck.

Initially the photomask 120 is positioned in the processing tool in a known location and the photomask reference marks are located using the device side alignment camera 110. The position and image of the reference marks are stored so they can be transferred to a display (not shown) for use with the backside alignment camera 150. The wafer chuck 140 is moved to a loading position (not illustrated) where a wafer 130 is placed on the wafer chuck with the backside up and device side down as illustrated. Note that the alignment marks formed on the device side are now viewable by the backside alignment camera 150 thru slots 142a and 142b. A vacuum source (not shown) is employed to hold the wafer to the chuck. The wafer chuck 140 then moves to an initial rough alignment position beneath the photo mask 120. At that point, an image of the photomask reference mark can be displayed on the backside alignment camera display. The backside alignment camera 150 focuses up through a slot 142 and superimposes its image on the display, along with the photomask reference mark image.

In operation, the operator or a machine automated system can move the wafer chuck 140 until the wafer alignment marks are visually centered with the photomask reference marks. The initial F2B alignment is typically done manually and subsequent alignments can be performed automatically. In alternative approaches the alignment can be performed entirely manually, or can be performed by an automated visual system such as a machine visual system, or the manual steps can complete the alignment. Using slot 142b, a second F2B alignment can be performed to ensure alignment. Additional alignment marks and reference marks can be used to further ensure proper alignment.

FIGS. 2A-C depict in a prior art illustration sample photomask reference marks and wafer alignment marks. Wafer 200 in FIG. 2A has scribe line alignment mark 230 as shown in the enlargement 210 in FIG. 2C. Photomask 202 in FIG. 2B has scribe line reference mark 220, 222 as shown in the enlargement 210 in FIG. 2C. In this example a "box/cross" alignment mark set is situated in a scribe line and can be used for aligning a wafer to a photomask. In this example, small box shapes 222 are set within a larger box shape 220 to serve as the photomask reference marks. A "cross" figure, depicted as 230 is formed on the wafer as the alignment mark. In one example for a conventional semiconductor process, the general dimension of the outer box of the reference mark 220 is typically 80 um×80 um, although other sizes could be used. This limits the minimum scribe street width 212 to greater than 80 um.

FIGS. 3A-3C depict in a second prior art illustration another sample photomask reference mark and the corresponding wafer alignment marks used in a conventional alignment process. In this example, wafer 300 in FIG. 3A has an alignment mark 330 formed in the scribe line as shown in the enlargement 310 in FIG. 3C. Photomask 302 in FIG. 3B has a corresponding reference mark 320 as shown in the enlargement 310 in FIG. 3C. In this example, a "circle/diamond" alignment mark set is situated in a scribe line and used for alignment of a wafer to a photomask. In this example illustrative implementation, the round dot 320 serves as the photomask reference mark. A "diamond" figure, depicted as 330, is formed on the wafer as the alignment mark. The general dimension of the diameter of the dot 320 in one example is 80 um. This limits the minimum scribe street width 312 to greater than 80 um.

On the semiconductor wafer, only the areas that are formed into circuits are eligible as finished devices for revenue generation, the other areas are used for items, such as scribe lines, process test structures, alignment marks and other test and visual inspection items, and these areas of the wafer all become part of the overhead in the manufacture of the semiconductor wafer. Because many of the processing steps in semiconductor manufacturing affect the entire wafer, some of the steps have costs that are somewhat independent of the number of devices that are provided per wafer. By increasing the number of devices per wafer, then, the per unit costs can be reduced. Accordingly, there is continual incentive to minimize the integrated circuit size, thus increasing the number of integrated circuit devices produced per each wafer processed, and thereby decreasing the unit cost. This also leads to continual incentive to reduce the non-device areas. Integrated circuits have continued to shrink as the minimum feature sizes of the semiconductor processes used for manufacture have shrunk. For this reason, a scribe line that is held to a minimum dimension of 80 ums or greater for example, in order to contain a corresponding alignment mark of a similar minimum dimension, will consume a larger and larger percentage of the wafer area as the device sizes shrink. The constant scribe line width increases costs and reduces the number of completed devices obtained per wafer.

Alignment marks with dimensions of about 80 um are already at a near minimum size that can be viewed at about 1× magnification, which is customary in the F2B alignment process utilizing backside alignment cameras currently used. A continuing need thus exists for solutions that enable the shrinking of the scribe lines to less than 60 um while maintaining alignment marks on the photomasks and on the wafers that are sufficiently large to be compatible with the existing photomask alignment infrastructure at 1× magnification. The solutions should be compatible with existing and future alignment equipment, and should be useful without the need to modify process tools already in production.

SUMMARY

Aspects of the present application include apparatus and methods that can be used to maintain photomask and wafer alignment marks that are viable for existing alignment infrastructure while enabling scribe line width to shrink with continuing advances in semiconductor processes.

In an example arrangement, an apparatus is provided including: a semiconductor wafer comprising a plurality of areas for the fabrication of integrated circuit devices on a device side, the integrated circuit devices arranged in rows and columns and spaced from one another by a plurality of scribe lines disposed on the semiconductor wafer in areas between the integrated circuit devices and free from integrated circuit devices; and one or more alignment marks disposed on the semiconductor wafer, the alignment marks each positioned in an intersection of two of the scribe lines; wherein the scribe lines have a first minimum dimension and the one or more alignment marks have a second minimum dimension that is greater than the first minimum dimension.

In a further arrangement, the above described apparatus is provided wherein the one or more alignment marks further comprise a shape formed of an intersection of a first longitudinal shape aligned in a first direction and aligned with a first set of scribe lines and a second longitudinal shape aligned in a second direction and aligned with a second set of scribe lines, and the first and second direction are perpendicular to one another.

In another arrangement that forms an additional aspect of the present application, in the above described apparatus, wherein the first minimum dimension is less than about 60 um.

In another arrangement that forms a further additional aspect of the present application, in the above described apparatus, the second minimum dimension is greater than about 80 um.

In another arrangement that forms a further additional aspect of the present application, in the above described apparatus, wherein the second minimum dimension is greater than about 96 um.

In yet another arrangement that forms an additional aspect of the present application, the apparatus described above is provided wherein the alignment mark is formed of a conductive material that is one taken from the group consisting essentially of tungsten, titanium, platinum, gold, aluminum, copper, tin, nickel, and alloys thereof.

In an another alternative arrangement that forms an additional aspect of the present application, a method is provided that includes aligning a wafer and a photomask, the method further including: providing a semiconductor wafer having at least one alignment mark positioned at an intersection of two scribe lines on a device side of the semiconductor wafer, the scribe lines being arranged between rows and columns of areas of the semiconductor wafer where integrated circuit devices are to be formed on the device side of the semiconductor wafer, the scribe lines having a first minimum dimension and the at least one alignment mark having a second minimum dimension that is greater than the first minimum dimension; providing a photomask to be aligned with the semiconductor wafer, the photomask having at least one reference mark corresponding to the at least one alignment mark on the semiconductor wafer; providing at least one camera for viewing the reference mark on the photomask in relation to the alignment mark on the semiconductor wafer so that a visual display contains a superposed image of both the reference mark and the alignment mark; and moving one of the photomask and the semiconductor wafer to perform an alignment using the relative positions of the alignment mark and the reference mark on the visual display until the semiconductor wafer and the photomask are aligned as indicated by visual alignment in the superposed image.

In a further arrangement, the above described method is performed and further includes: positioning the semiconductor wafer with the backside arranged away from a wafer chuck in preparation for a process to be performed on the backside of the wafer; positioning the photomask over the backside of the wafer, the at least one camera observing the reference mark on the backside of the wafer; positioning a backside camera beneath the semiconductor wafer, the backside camera observing the alignment mark on the device side of the semiconductor wafer; and using a superposed image including the reference mark and the alignment mark, moving at least one of the semiconductor wafer and the photomask until the semiconductor wafer and the photomask are aligned as indicated by alignment in the superposed image.

In another alternative arrangement that forms an additional aspect of the present application, in the methods above, providing the reference mark on the photomask further includes providing the reference mark that has a shape corresponding to a shape of the alignment mark and having a third minimum dimension that is greater than or equal to the second minimum dimension.

In a further alternative arrangement that forms an additional aspect of the present application, in the methods above, providing the alignment mark further includes wherein the at least one alignment mark further includes two or more alignment marks spaced apart on the semiconductor wafer.

In still another alternative arrangement that forms an additional aspect of the present application, a semiconductor wafer is provided that includes: a plurality of MEMS devices formed in integrated circuits on a device side of a semiconductor wafer, the plurality of integrated circuits including MEMS devices separated by scribe lines into rows and columns of integrated circuits; and at least one alignment mark on the device side of the semiconductor wafer, the alignment mark positioned at an intersection of two of the scribe lines, the two intersecting scribe lines having a first minimum dimension and the at least one alignment mark having a second minimum dimension, where the second minimum dimension is greater than the first minimum dimension.

In yet another alternative arrangement that forms yet another alternative arrangement, the semiconductor wafer described above is provided and further includes an opening formed on the backside of the semiconductor wafer and extending to at least one of the plurality of MEMS devices.

Use of the apparatus and methods of the arrangements that form aspects of the present application overcome the deficiencies of the prior known approaches by providing alignment marks on a semiconductor wafer of sufficient minimum dimension to enable use of existing alignment infrastructure while yet enabling the minimum dimensions of scribe lines on the semiconductor wafer to shrink, reducing scribe line area and thereby increasing the available devices per wafer.

BRIEF DESCRIPTION OF THE DRAWINGS

For a more complete understanding of the illustrative examples of aspects of the present application that are described herein and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the illustrative example arrangements and are not necessarily drawn to scale.

DETAILED DESCRIPTION

The making and using of various example illustrative arrangements that incorporate aspects of the present application are discussed in detail below. It should be appreciated, however, that the illustrative examples disclosed provide many applicable inventive concepts that can be embodied in a wide variety of specific contexts. The specific examples and arrangements discussed are merely illustrative of specific ways to make and use the various arrangements, and the examples described do not limit the scope of the specification, nor do they limit the scope of the appended claims.

Relative positioning terms such as "above," "beneath," "top," "bottom," "up," "down," "upwards," "downwards," are used herein to clearly illustrate the operations of the apparatus and methods discussed. However, these relative positional terms are used for the purposes of clarity of discussion and are not to be read as limiting the arrangements that form aspects of the present application to a particular orientation or arrangement or to be read as limiting the scope of the appending claims or to be used to limit the scope of the appended claims to a particular orientation or arrangement that is described herein. Various modifications that change the positional orientation while still practicing the novel methods and apparatus of the present application will be apparent to one skilled in the art, these various modifications are contemplated by the inventors as forming further arrangements that form additional aspects of the present application and which are within the scope of the appended claims.

Figure 1A:
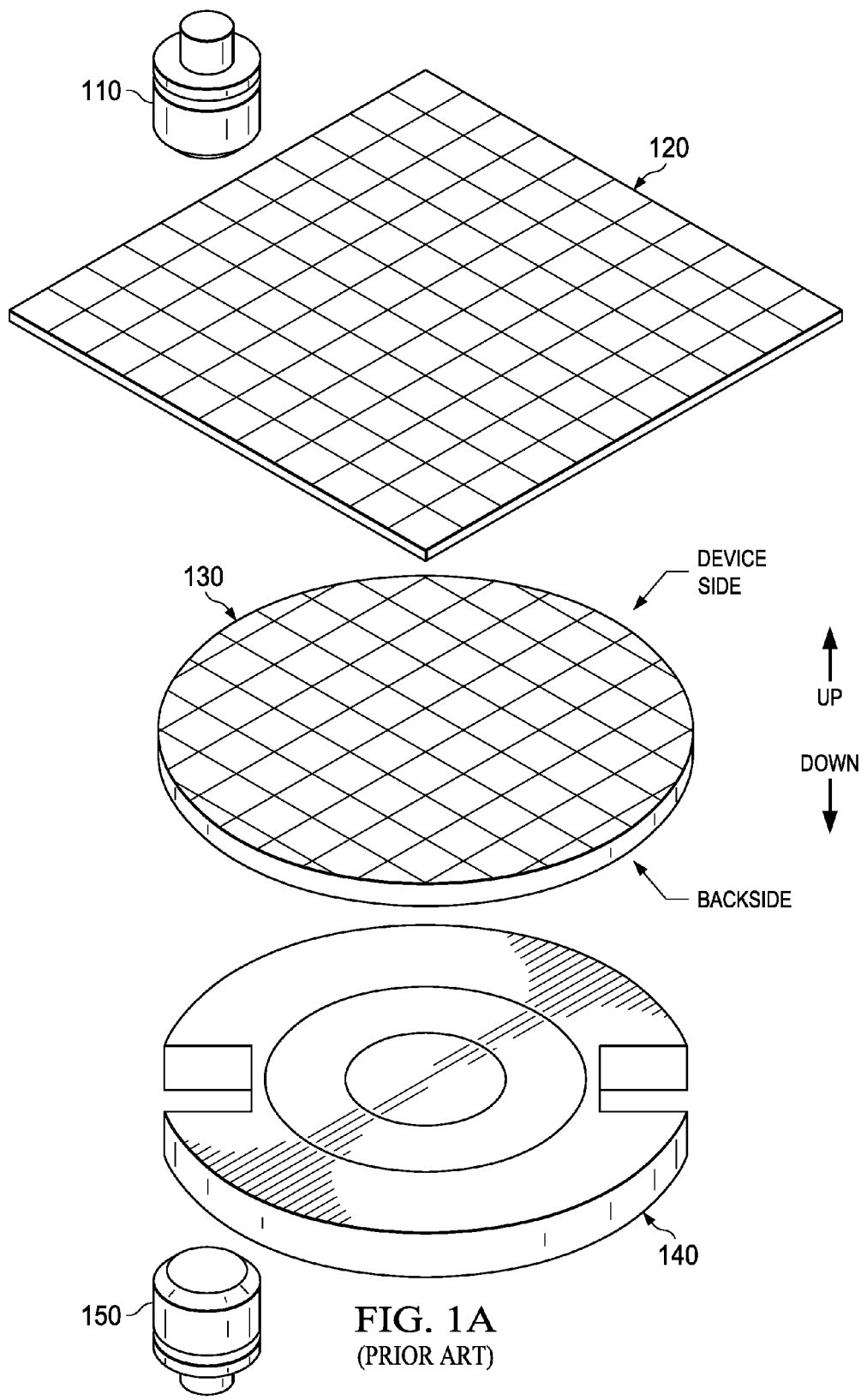
FIGS. 1A-1B depict in prior art illustrations the various components involved in the device side alignment and in front to back alignment.
Figure 1B:
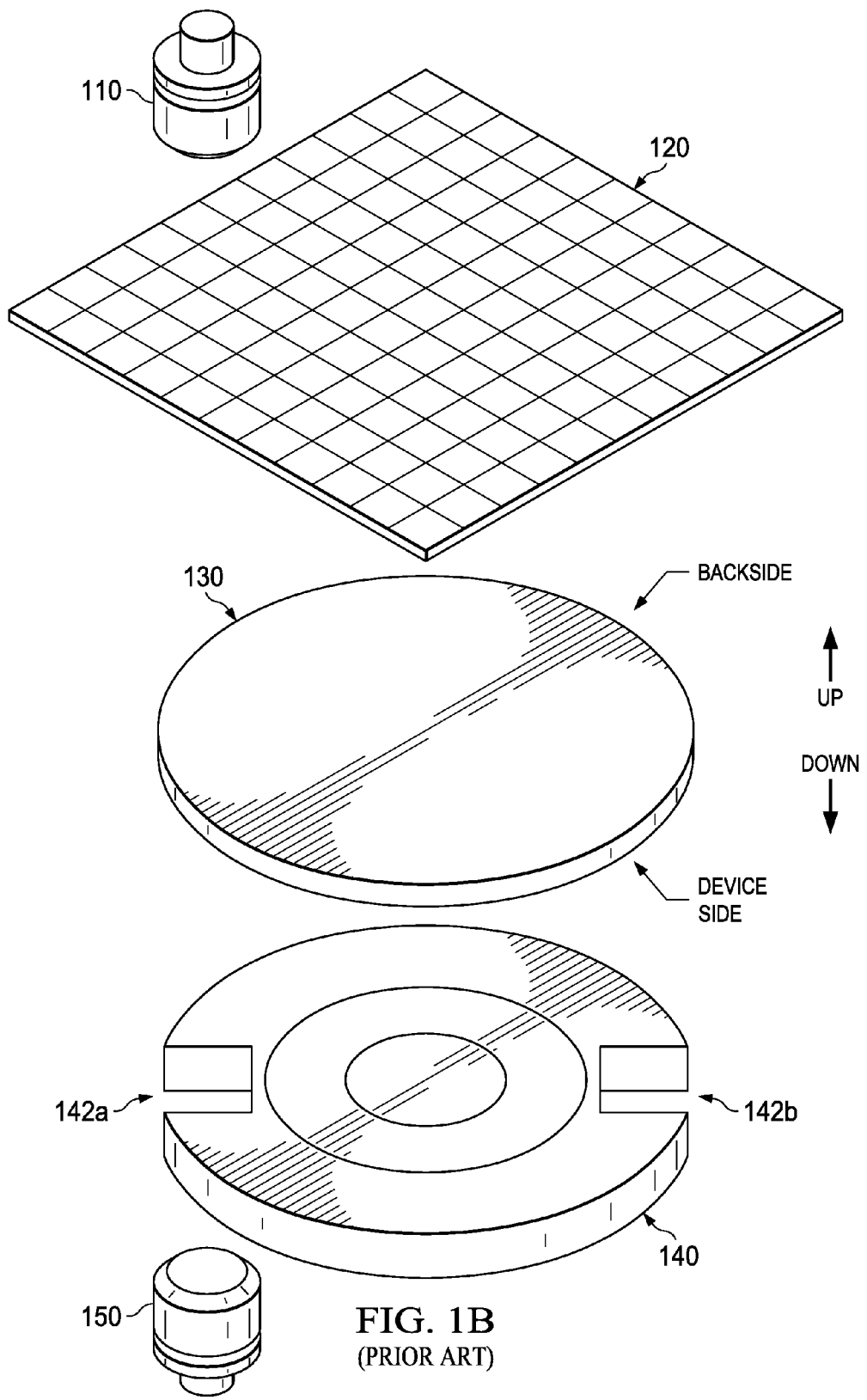
Figure 2A:
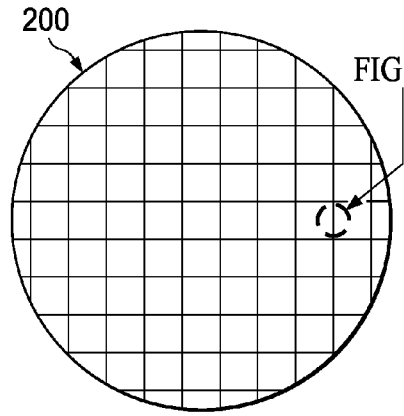
FIGS. 2A-C depict in prior art illustrations sample photomask reference marks and wafer alignment marks.
Figure 2B:
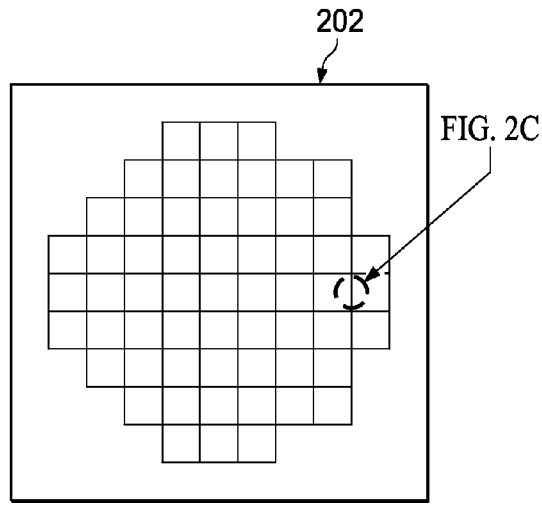
Figure 2C:
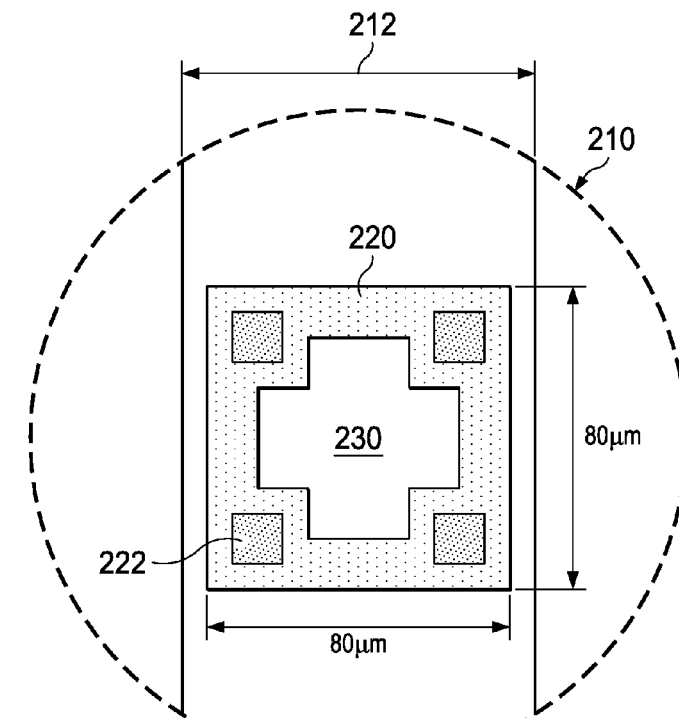
Figure 3A:
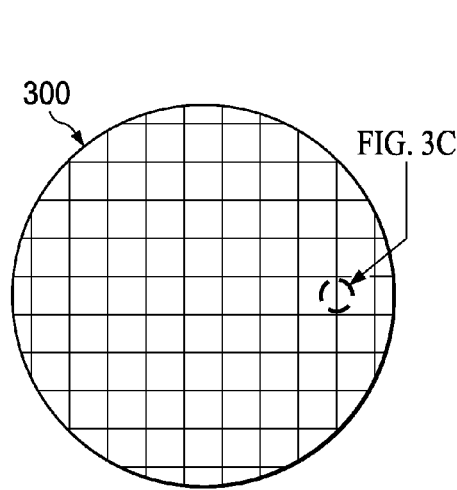
FIGS. 3A-C depict in prior art illustrations another sample photomask reference mark and the corresponding wafer alignment marks used in a conventional alignment process.
Figure 3B:
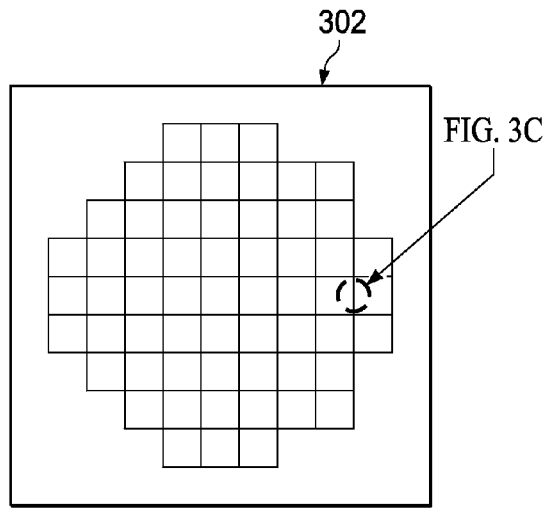
Figure 3C:
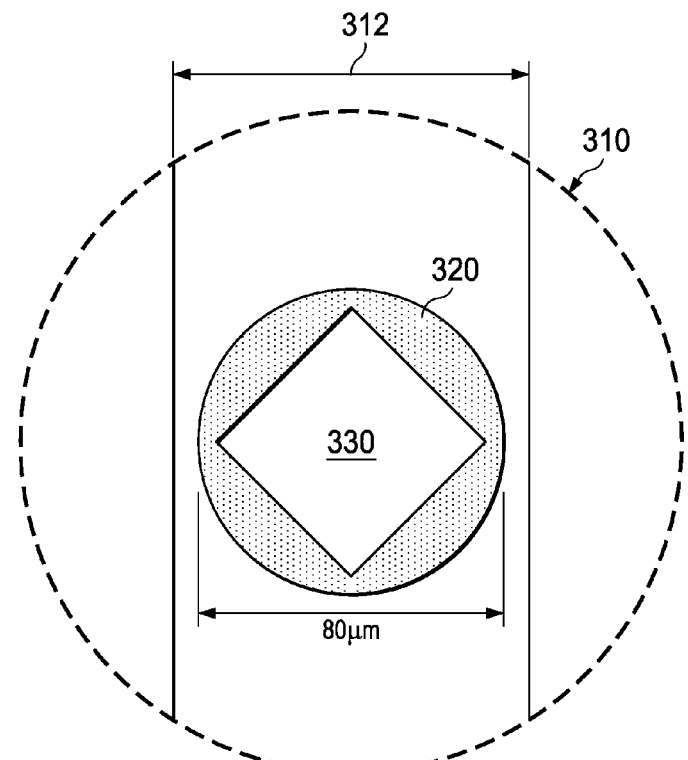
Figure 4A:
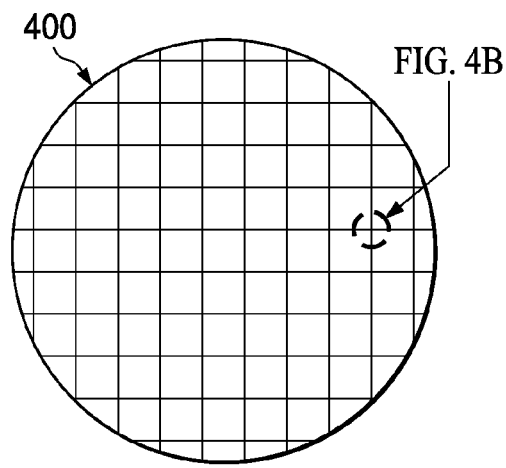
FIGS. 4A-B depict an example arrangement of a wafer alignment mark that forms an aspect of the present application.
Figure 4B:
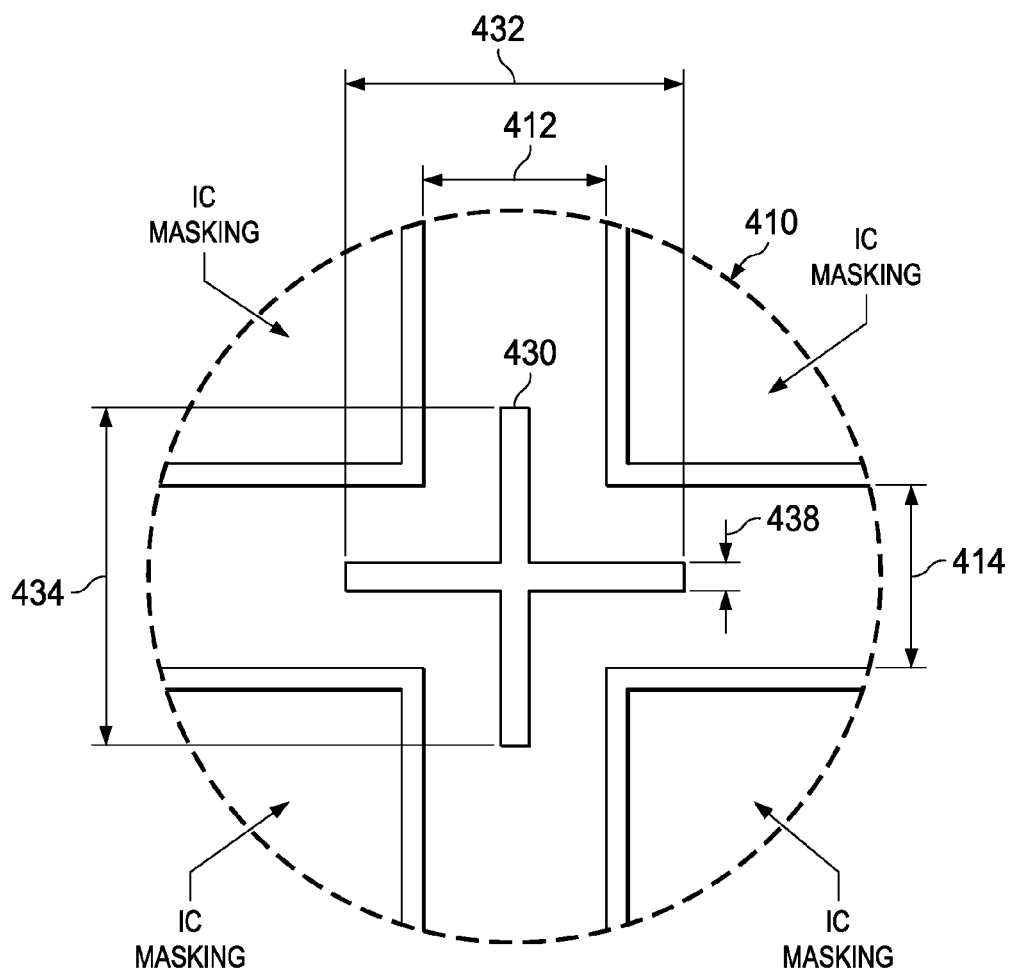
Figure 5A:
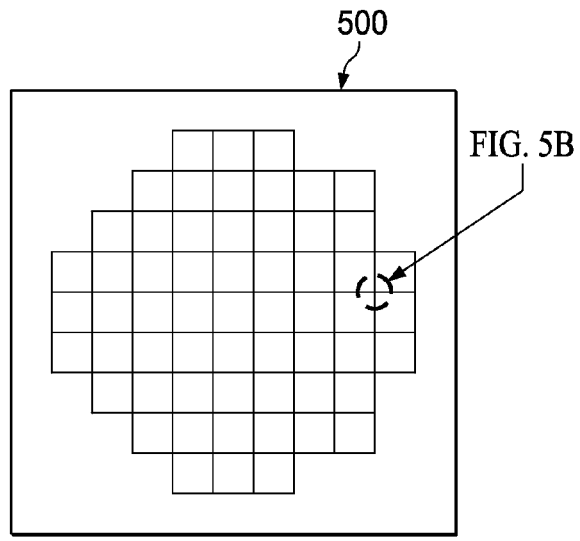
FIGS. 5A-B depict an arrangement of a photomask reference mark that forms an additional aspect of the present application.
Figure 5B:
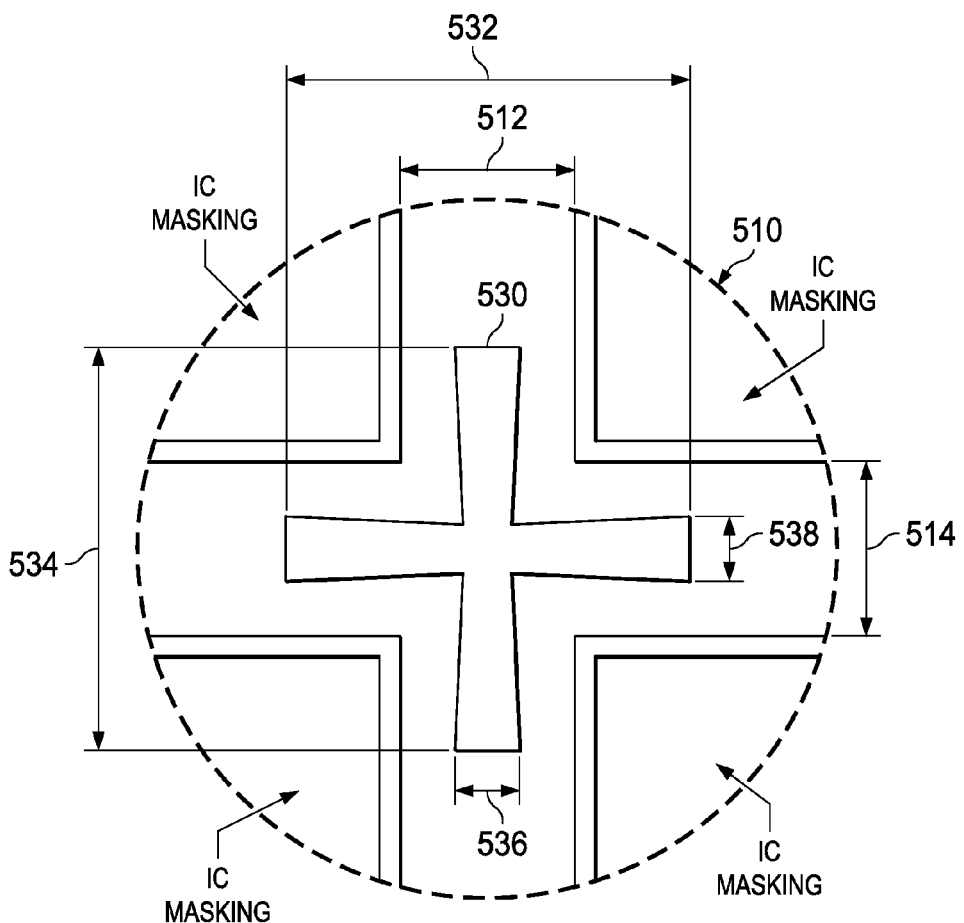

FIGS. 4A-4B depict an example illustrative arrangement of a wafer alignment mark that forms an aspect of the present application. FIGS. 5A-5B illustrate a corresponding reference mark. Wafer 400 in FIG. 4A and in the enlargement of FIG. 4B has wafer alignment mark 430 situated in the intersection of the scribe lines as shown in the enlargement 410. In this aspect of the present application, the cross shape 430 has vertical dimensions 434 of greater than at least 80 um and in another example a vertical dimension that is greater than 96 um and horizontal dimensions 432 of greater than at least 80 um and in another example a horizontal dimension that is greater than 96 um. The arm width 438 of each of the arms in the alignment mark 430 has a width which is less than the reference mark arm width 538 (visible on the photomask 500 illustrated in an enlargement in FIG. 5B). The dimensions of the alignment mark are arranged to maintain a useful visible size when viewed by an operator or an automated visual system through optics with 1× magnification. Locating this arrangement of the present application in the scribe line intersection enables the scribe line widths 412 and 414 to be less than about 60 um while still maintaining the alignment mark 430 at a usable visible size. The intersection of the 2 bars that compromise the alignment mark 430 can be arranged to intersect in the middle of the scribe line intersection or at some other offset, as long as the minimum lengths 434 and 432 are maintained. Various modifications in the shapes of the alignment mark are contemplated, the plain cross shapes shown here are but one possible shape. The alignment mark 430 can be formed as a portion of a metallization layer and can be dark or reflective material. The alignment mark 430 can also be trenched or etched using laser etching or other etch processes.

FIGS. 5A-5B depicts an arrangement of a photomask and reference mark that forms an additional aspect of the present application. Photomask 500 has a reference mark situated in a position that corresponds to the intersection of the scribe lines on a wafer as shown in the enlargement 510. In this aspect of the present application, the reference mark 530 has a modified cross shape that has vertical dimensions 534 of greater than about 80 ums in one example, and in another example, is about 96 um and the reference mark has a horizontal dimension 532 of greater than 80 ums in one example and which is about 96 um in another example arrangement to maintain a usable, visible size at 1× magnification. The reference mark also has widths 538 and 536 which are greater than the width 438 of the corresponding wafer alignment mark 420 depicted in FIGS. 4A-4B. By locating this arrangement reference mark in the scribe line intersection, the scribe line widths 512 and 514 can be less than 60 ums, for example, or less. The modified cross-shape that compromises the reference mark 530 can be located in the middle of the scribe line intersection or the intersection of the 2 shapes that form the modified cross shape of the reference mark 530 can be offset as long as the minimum lengths of portions 532 and 534 are maintained. In the arrangements of the present application, various alignment marks and reference marks can be used with the alignment marks having a minimum dimension in at least one direction that is greater than the minimum dimension of the scribe lines the reference marks are disposed within. For example a scribe line may have a width of 60 ums, or less, in the arrangements that form aspects of the present application, while the corresponding alignment marks have a minimum dimension greater than the minimum width of the scribe line. In some example arrangements, the minimum dimension of the reference mark can be greater than about 80 um, and in other examples can be greater than or equal to about 96 ums. However other arrangements where a minimum dimension of the reference mark is greater than the minimum dimension of the scribe lines are also contemplated. Various shapes and sizes of the reference marks and the alignment marks are contemplated by the inventors of the present application as additional arrangements providing further aspects of the application, and these various arrangements form additional aspects of the present application and are within the scope of the appended claims.

Figure 6A:
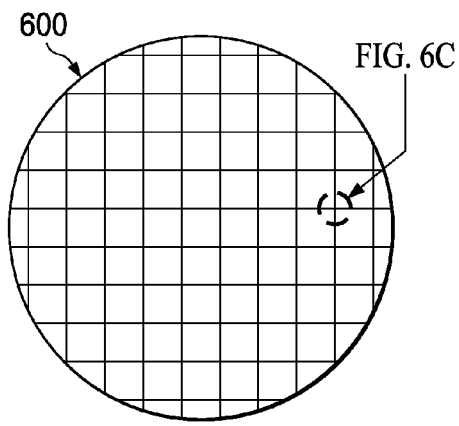
FIGS. 6A-C depict in another example arrangement a centered overlay alignment mark and reference mark that form a further aspects of the present application.
Figure 6B:
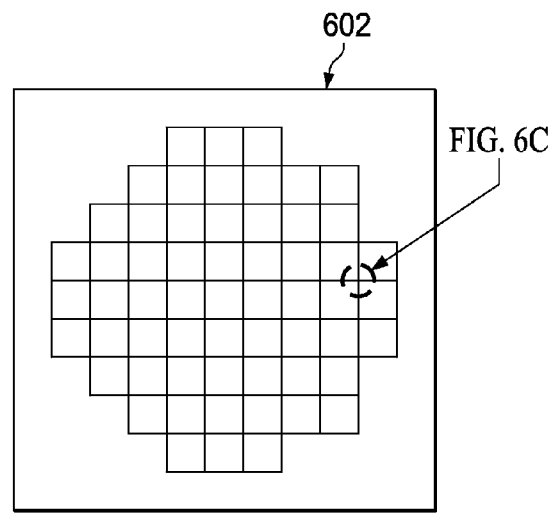
Figure 6C:
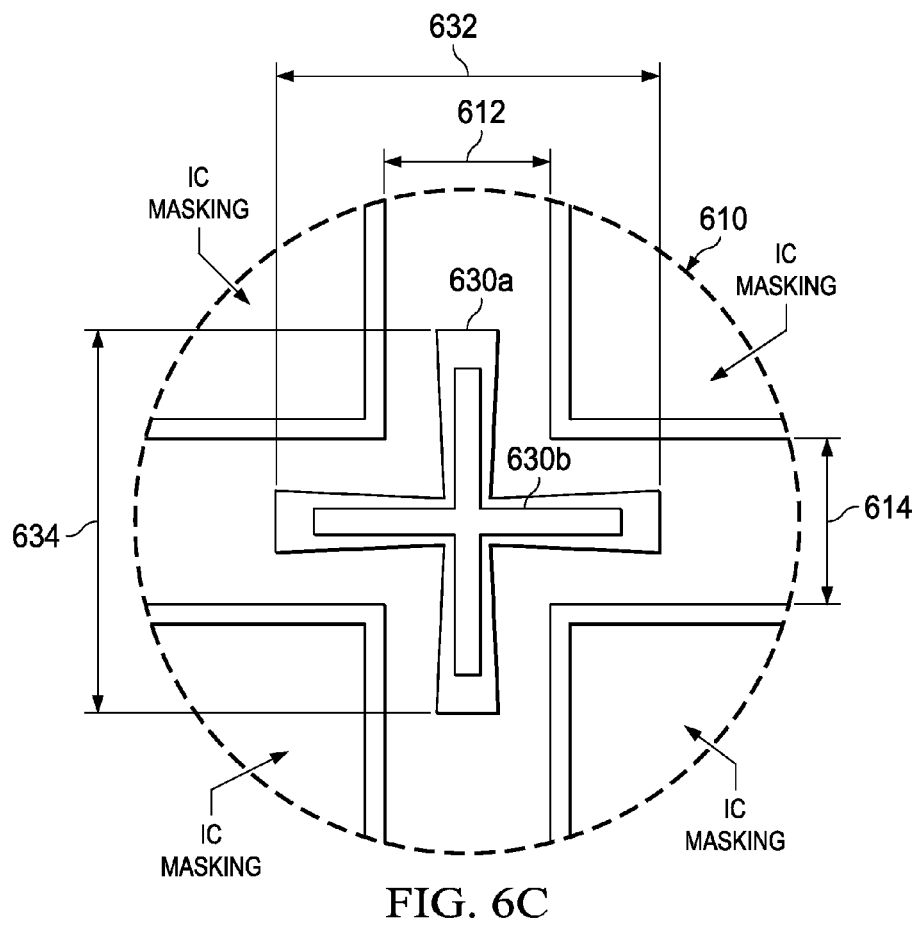

FIGS. 6A-6C depict in another example arrangement a centered overlay alignment mark and reference mark that form a further aspects of the present application. In FIG. 6A, wafer 600 has an alignment mark 630b situated in the intersection of the scribe lines as shown in the enlargement 610. Photomask 602 in FIG. 6B has a corresponding reference mark 630a forming an aspect of the present application situated at a position corresponding to the intersection of the scribe lines as shown in the enlargement 610. In the enlargement 610 in FIG. 6C, an aspect of the present application is shown with the reference mark 630a from the mask and the alignment mark 630b on the wafer shown superposed and centered. The centered view of the alignment mark and reference mark allow precise alignment of the wafer 600 to the photomask 602 by either human eye at 1× magnification since the minimum dimensions of 632 and 634 can be larger than about 80 ums, and in one example, 96 um. This size is greater than the scribe line widths 614, 612 and enables visual confirmation of alignment using 1× magnification as is present in conventional alignment tools. In a F2B alignment, the reference mark seen on the mask by a top side camera or microscope can be visually superposed with the wafer alignment mark seen by a backside camera or microscope, and alignment can be achieved by moving the wafer or photomask until the relative positions are centered as seen visually by inspection of the superposed marks in a display.

Figure 7A:
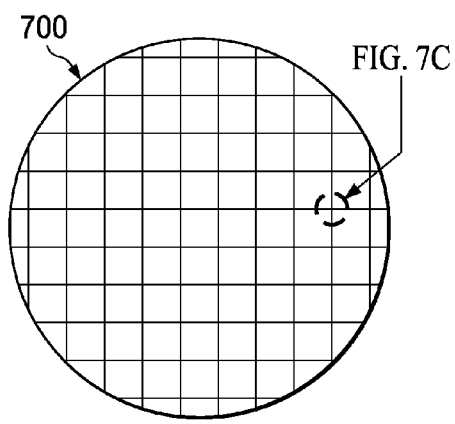
FIGS. 7A-C depict in an alternative arrangement a centered overlay that forms another aspect of the present application.
Figure 7B:
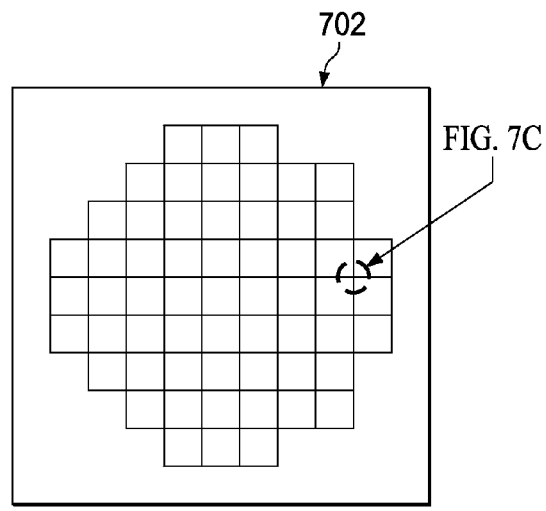
Figure 7C:
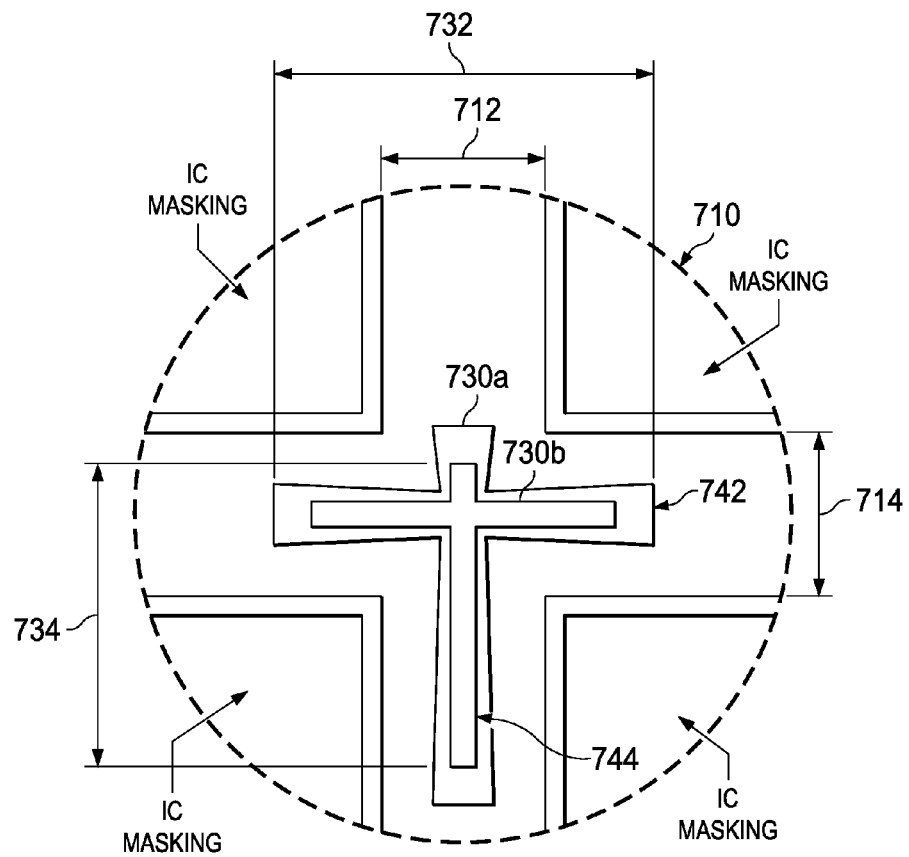

FIGS. 7A-7C depict an alternative arrangement for a centered overlay that forms another aspect of the present application. Wafer 700 in FIG. 7A has an alignment mark 730b situated in the intersection of the scribe lines as shown in the enlargement 710 in FIG. 7C. Photomask 702 illustrated in FIG. 7B has a reference mark 730a that is an arrangement forming an additional aspect of the present application situated in a position corresponding to the intersection of the scribe streets as shown in the enlargement 710 in FIG. 7C. In the enlargement 710, an aspect of the present application is shown with the reference mark 730a from the mask and the alignment mark 730b on the wafer is seen in a superposed and centered view. The centered view of the superposed alignment mark 730b and reference mark 730a allow for precise visual alignment of the wafer 700 to the photomask 702 to be performed by an operator's human visual system at 1× magnification since the dimensions of 732 and 734 can be larger than scribe street widths 712 and 714 or about 96 um. In other arrangements, the minimum dimensions 732, 734 can be larger than about 80 um which is still greater than the minimum scribe line widths 712 and 714. In this example arrangement, the vertical bar 744 is offset towards the bottom of the horizontal bar 742 and still maintains its dimension of greater than 96 um. It is contemplated in another aspect of the present application that the vertical bar 744 could remain centered in the scribe line 714 and the horizontal bar 742 could be offset to the right or left of the vertical bar 744.

Figure 8A:
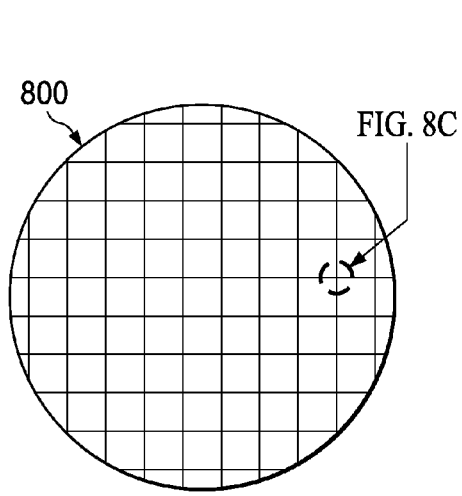
FIGS. 8A-C depict another alternative arrangement for a centered overlay alignment and reference mark that forms another aspect of the present application.
Figure 8B:
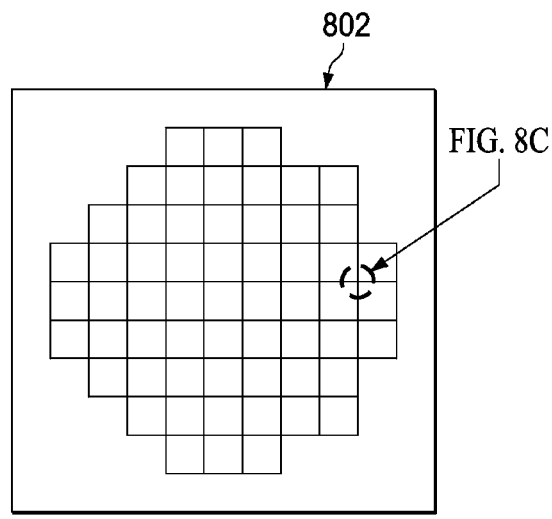
Figure 8C:
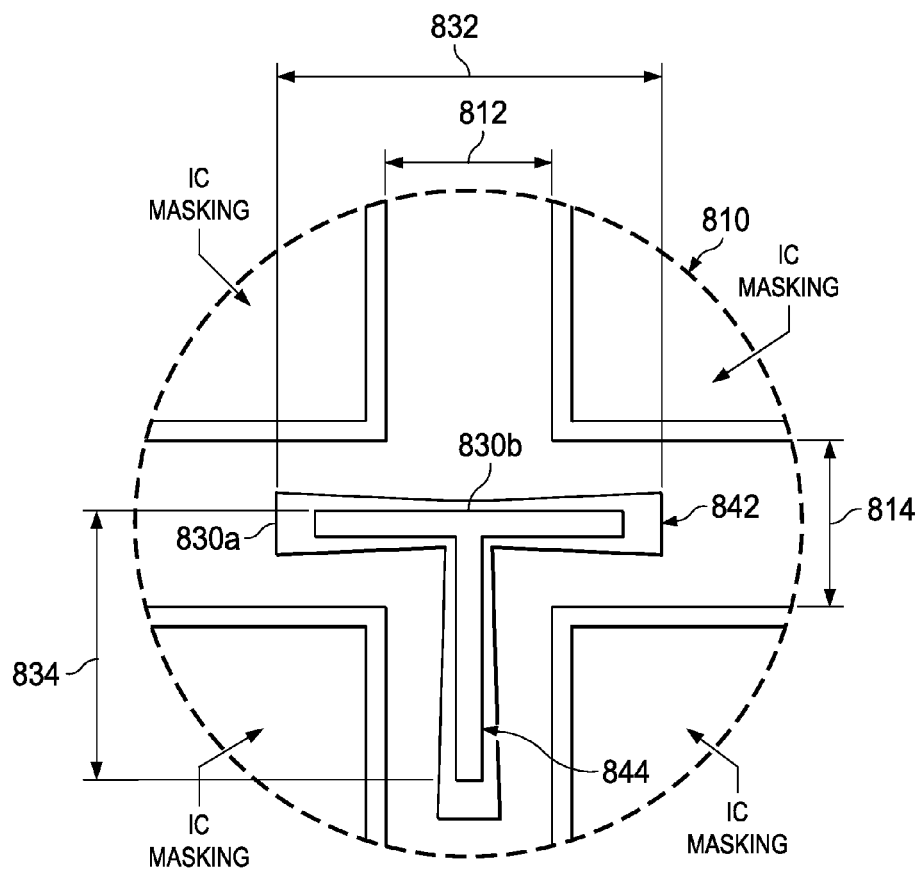

FIGS. 8A-8C depict another alternative arrangement for a centered overlay alignment and reference mark that forms another aspect of the present application. Wafer 800 in FIG. 8A has an alignment mark 830b situated in the intersection of the scribe lines as shown in the enlargement 810 in FIG. 8C. Photomask 802 in FIG. 8B has a corresponding reference mark 830a situated in the intersection of the scribe streets as shown in the enlargement 810 in FIG. 8C. In the enlargement 810, an aspect of the present application is shown with the reference mark 830a from the mask and the alignment mark 830b on the wafer in a superposed and centered view. The centered view of the alignment mark 830b and reference mark 830a allow precise alignment of the wafer 800 to the photomask 802 by either human eye at 1x magnification since the dimensions of 832 and 834 can be larger than scribe street widths 812 and 814, for example 80 ums or even 96 ums.

In performing alignment in a F2B alignment system, the front side camera or microscope can view the reference mark on the photomask 802, while the backside camera or microscope can view the alignment mark on the device side of the wafer 800, because for a backside process the wafer is oriented so that the device side now faces the wafer chuck and the backside camera or microscope. Optics can be used to display the two marks 830a, 830b in a superposed view as shown in FIG. 8C for either front side or F2B alignment. In this aspect of the present application, the vertical bar 844 is completely offset towards the bottom of the horizontal bar 842 and still maintains its dimension of greater than scribe line widths 812 and 814 or about 80 um, and in one example, greater than 96 um. It is contemplated in another aspect of the present application that the vertical bar 844 could remain centered in the street 814 and the horizontal bar 842 could be offset to the right or left of the vertical bar 844. In this way the alignment mark 830b and the corresponding reference mark 830a remain visible using 1× or low magnification cameras or microscopes, while the scribe line dimensions can be reduced to 60 um or less to save wafer area and increase device yield.

In addition to the examples described above, various modifications can also be made in the order of steps and in the number of steps to form additional novel arrangements that incorporate aspects of the present application, and these modifications will form additional alternative arrangements that are contemplated by the inventors as part of the present application and which also fall within the scope of the appended claims.

Although the example illustrative arrangements have been described in detail, it should be understood that various changes, substitutions and alterations can be made herein without departing from the spirit and scope of the present application as defined by the appended claims.

Moreover, the scope of the present application is not intended to be limited to the particular illustrative example arrangement of the process, machine, manufacture, and composition of matter means, methods and steps described in this specification. As one of ordinary skill in the art will readily appreciate from the disclosure, processes, machines, manufacture, compositions of matter, means, methods or steps, presently existing or later to be developed, that perform substantially the same function or achieve substantially the same result as the corresponding example arrangements described herein may be utilized according to the illustrative arrangements presented and alternative arrangements described, suggested or disclosed. Accordingly, the appended claims are intended to include within their scope such processes, machines, manufacture, compositions of matter, means, methods, or steps.

What is claimed is:

1. A method of aligning a wafer and a photomask, the method comprising:
  providing a semiconductor wafer having at least one alignment mark positioned at an intersection of two scribe lines on a device side of the semiconductor wafer, the scribe lines being arranged between rows and columns integrated circuit devices on the device side of the semiconductor wafer, the scribe lines having a first minimum dimension and the at least one alignment mark having a second minimum dimension that is greater than the first minimum dimension;

providing a photomask to be aligned with the semiconductor wafer, the photomask having at least one reference mark corresponding to the at least one alignment mark on the semiconductor wafer;

providing at least one camera for viewing the reference mark on the photomask in relation to the alignment mark on the semiconductor wafer so that a visual display contains a superposed image of both the reference mark and the alignment mark; and moving one of the photomask and the semiconductor wafer to perform an alignment using relative positions of the alignment mark and the reference mark on the visual display until the semiconductor wafer and the photomask are aligned as indicated by visual alignment in the superposed image.

2. The method of claim 1, and further comprising:

positioning the semiconductor wafer with a backside of the semiconductor wafer arranged away from a wafer chuck in preparation for a process to be performed on the backside of the wafer;

positioning the photomask over the backside of the wafer, the at least one camera observing the reference mark on a backside of the wafer; and positioning a backside camera beneath the semiconductor wafer, the backside camera observing the alignment mark on the device side of the semiconductor wafer; and using a superposed image including the reference mark and the alignment mark, moving at least one of the semiconductor wafer and the photomask until the semiconductor wafer and the photomask are aligned as indicated by alignment in the superposed image.

3. The method of claim 2, wherein providing the alignment mark further comprises:

providing a first longitudinal shape aligned with a first plurality of the scribe lines in a first direction and providing a second longitudinal shape aligned with a second plurality of the scribe lines a second direction that is perpendicular to the first direction, the first longitudinal shape intersecting the second longitudinal shape to form the alignment mark.

4. The method of claim 3 wherein providing the alignment mark further comprises providing a cross shaped alignment mark that has four portions extending equal distances from a central intersection that is centered at the scribe line intersection.

5. The method of claim 4 wherein providing the alignment mark further comprises providing a T shaped alignment mark.

6. The method of claim 2 wherein the reference mark on the photomask has a shape corresponding to a shape of the alignment mark and having a third minimum dimension that is greater than or equal to the second minimum dimension.

7. The method of claim 6, wherein moving one of the photomask and the semiconductor wafer to perform an alignment using the relative positions of the alignment mark and the reference mark on the visual display until the semiconductor wafer and the photomask are aligned as indicated by visual alignment in the superposed image further comprises visually confirming the alignment mark is entirely visible through the reference mark in the superposed image.

8. The method of claim 1 wherein providing the at least one alignment mark further comprises providing two or more alignment marks spaced apart on the semiconductor wafer.

* * * * *